United States Patent [19]

Sato et al.

[11] Patent Number: 5,607,097
[45] Date of Patent: Mar. 4, 1997

[54] COMPONENT-MOUNTED CIRCUIT BOARD PRODUCTION SYSTEM

[75] Inventors: Kenichi Sato, Ikoma; Koichi Kanematsu, Hirakata; Hiroaki Fujiwara, Takatsuki; Yasuhiro Okada, Moriguchi, all of Japan

[73] Assignee: Matsushita Electric Industrial Co., Ltd., Osaka-fu, Japan

[21] Appl. No.: 261,101

[22] Filed: Jun. 16, 1994

[30] Foreign Application Priority Data

Jun. 17, 1993 [JP] Japan ................................. 5-146448

[51] Int. Cl.$^6$ ........................................................ B23K 3/00
[52] U.S. Cl. .................................... 228/8; 228/9; 228/102
[58] Field of Search ................................. 228/8, 9, 102, 228/105, 104

[56] References Cited

U.S. PATENT DOCUMENTS

5,145,099  9/1992  Wood et al. ............................. 228/105

*Primary Examiner*—Kenneth J. Ramsey
*Attorney, Agent, or Firm*—Wenderoth, Lind & Ponack

[57] ABSTRACT

A production system for mounting components on circuit boards includes a solder printing unit having a solder printing device for printing solder onto lands of a circuit board and a solder printing inspecting device for inspecting a printing state the solder, a component mounting unit having a component mounting device for mounting a component to a predetermined position of the printed solder on the circuit board and a component mounting inspecting device for inspecting a mounting state of the component, and a soldering unit having a soldering device for melting and hardening the printed solder and a soldering inspecting device for inspecting a soldering state of the soldering. The system further includes a data memory, a first information data input device for inputting into the data memory first data related to each of the devices in the printing unit, component mounting unit, and soldering unit, and a second information data input device for inputting into the data memory second data related results of countermeasures executed based on the inputted first data of the three inspecting devices. The system still further includes a correlation analyzing part which combines corresponding items of the first and second data stored in the data memory and analyzes a frequency of each item, thereby generating rules which to predict or estimate a result from a cause, a cause from a result, and a result from a maintenance work among the first data, second data, and maintenance works.

12 Claims, 9 Drawing Sheets

COMPONENT-MOUNTED CIRCUIT BOARD PRODUCTION SYSTEM

BACKGROUND OF THE INVENTION

The present invention relates to a production system for mounting electronic components to circuit boards.

A conventional example of the production system referred to above will be described with reference to FIG. 8.

Figure 8:
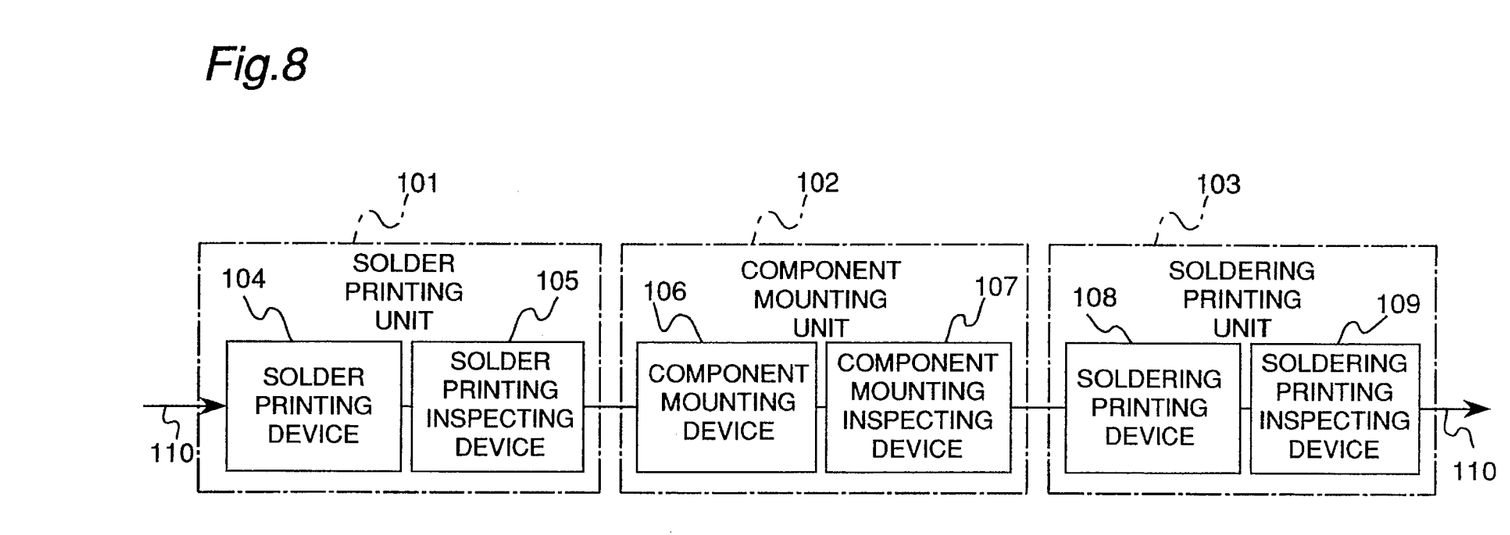
FIG. 8 is a structural block diagram of a conventional production system of mounting electronic components on circuit boards.

As shown in FIG. 8, a solder printing unit 101, a component mounting unit 102 and a soldering unit 103 are sequentially arranged in the downstream direction along a transfer line 110 of a production system.

In the solder printing unit 101, a solder printing device 104 prints cream solder on lands of a to-be-printed article such as a circuit board or the like. An inspecting device 105 inspects the state of both the circuit board and the solder printing unit 101 along with the printing state.

In the component mounting unit 102, a component mounting device 106 moves a suction nozzle using an XY driving device, so that the suction nozzle transfers an electronic component to a mounting position on the circuit board from a feeding position. The electronic component is placed on the cream solder printed on the land of the circuit board while a component recognizing camera controls the suction nozzle to avoid erroneous operations. An inspecting device 107 inspects the state of the component and the component mounting unit 102 and also the mounting state of the component.

On the other hand, in the soldering unit 103, the circuit board transferred on a transfer conveyor from the solder printing unit 101 and component mounting unit 102 is heated by the hot wind of a heater and a fan of a soldering device 108 in a reflow furnace, so that the solder is melted. Subsequently, the solder is cooled and hardened to be set. A soldering inspecting device 109 inspects both the state of the soldering unit 103 and the soldering state.

In the case where the equipment experiences some types of trouble, the equipment is stopped, and a trouble message displayed on the monitor of each device. A machine operator makes repair work based on the message.

For preventive maintenance, a predetermined maintenance work is carried out for each device at a suitable occasion in accordance with the judgement of the machine operator.

The quality of products is summed and analyzed independently for every product irrespective of the trouble of the equipment or whether the maintenance work is executed.

Likewise, the quality of the equipment is summed and analyzed separately for each device irrespective of the trouble or maintenance work.

In the above-described conventional arrangement, the inspecting data of the quality of products, the data related to the solution of troubles, and the data related to the execution of the maintenance work are summed and analyzed independently and separately with no correlation therebetween. Therefore, it is impossible in the conventional analyzing system to predict or estimate the effect or result from the cause, or vice versa for the quality of products, troubles, and maintenance work.

Because of the aforementioned drawback inherent in the prior art, the equipment suddenly runs into trouble in some cases, and the product quality cannot be secured stably.

Moreover, the troubles are handled without any special thought and largely depending on the skill of the experienced operators. It is consequently difficult to represent the countermeasures against troubles by numerical values or rules to take suitable actions promptly in response to the troubles. Since trouble-shooting takes a lot of time, the working efficiency of the equipment is greatly decreased.

SUMMARY OF THE INVENTION

The object of the present invention is therefore to provide a production system of mounting components on circuit boards, with an aim to solve the above-discussed disadvantages inherent in the prior art, whereby the data, for example, related to the inspection of products, handling of troubles and execution of the maintenance work are summed and analyzed correlatively, thereby making it possible to predict or estimate the result from the cause and the cause from the result for the inspection of products, handling of troubles and execution of the maintenance work, or the result from the maintenance work and actions.

In accomplishing these and other objects, according to a first aspect of the present invention, there is provided a production system of mounting components on circuit boards, comprising:

a solder printing unit having a solder printing device for printing solder onto lands of a circuit board and a solder printing inspecting device for inspecting a state of a printing of the solder;

a component mounting unit having a component mounting device for mounting a component to a predetermined position of the printed solder on the circuit board and a component mounting inspecting device for inspecting a mounting state of the component;

a soldering unit having a soldering device for melting and hardening the printed solder and a soldering inspecting device for inspecting a state of the soldering;

a memory means;

a first information data input means for inputting into the memory means first data related to all of the devices in the printing unit, component mounting unit, and soldering unit;

a second information data input means for inputting into the memory means second data related results of countermeasures executed based on the inputted first data of the three inspecting devices;

a correlation analyzing part which combines corresponding items of the first and second data stored in the memory means and analyzes a frequency of each item, thereby making a rule to predict or estimate a result from a cause, a cause from a result, and a result from a maintenance work or action among the first data, second data, and maintenance works.

According to a second aspect of the present invention, there is provided a production system of mounting components on circuit boards, comprising:

a solder printing unit having a solder printing device for printing solder onto lands of a circuit board and a solder printing inspecting device for inspecting a state of a printing of the solder;

a component mounting unit having a component mounting device for mounting a component to a predetermined position of the printed solder on the circuit board and a component mounting inspecting device for inspecting a mounting state of the component;

a soldering unit having a soldering device for melting and hardening the printed solder and a soldering inspecting device for inspecting a state of the soldering;

a memory means;

a first information data input means for inputting into the memory means first data which is related to all of the devices in the printing unit, component mounting unit, and soldering unit and include equipment trouble information caused in the devices in the printing unit, component mounting unit, and soldering unit, maintenance information of maintenances executed in the devices in the printing unit, component mounting unit, and soldering unit, and equipment quality information of the devices in the printing unit, component mounting unit, and soldering unit;

a second information data input means for inputting into the memory means second data which are related results of countermeasures executed based on the inputted first data of the three inspecting devices and include product quality information obtained by inspection of the inspecting devices in the printing unit, component mounting unit, and soldering unit, and maintenance result information related results of maintenances executed in the devices in the printing unit, component mounting unit, and soldering unit;

a correlation analyzing part which combines corresponding items of the first and second data stored in the memory means and analyzes a frequency of each item, thereby making a rule to predict or estimate a result from a cause, a cause from a result, and a result from a maintenance work or action among the first data, second data, and maintenance works.

According to a third aspect of the present invention, there is provided a method of using a production system including the structure in the second aspect which comprises:

a first step of inspecting whether or not there is equipment trouble, equipment quality deficiency, or product quality failure based on the data inputted by the input means;

a second step executing a maintenance work for the trouble, deficiency, or failure and registering the work in the memory means when it is decided at the first step that there is equipment trouble, equipment quality deficiency, or product quality failure;

a third step of registering product quality information and maintenance work result information in the memory means after the maintenance work is executed at the second step;

a fourth step of combining each item of each information from the equipment trouble information, the product quality information, the maintenance work information, the maintenance work result information, and the equipment quality information, and then analyzing a frequency of each item, and then deciding whether or not the frequency is significant so that the maintenance work is effective, after the third step is executed;

a fifth step of making a rule for predicting a result from a cause, a cause from a result, and a result from a maintenance work, among the equipment troubles, product qualities, and maintenance works, when it is decided at the fourth step that the maintenance work is effective;

a sixth step of deciding based on the data inputted by the input means whether or not there is equipment trouble, equipment quality deficiency, or product quality failure in each of a case where it is decided at the fourth step that the maintenance work is not effective and a case where the fifth step has been executed; and a seventh step of instructing, if there is a rule, a maintenance work or action to be executed, based on the rule and the equipment trouble information, the product quality information, and the equipment quality information, but if there is no rule, deciding based on data inputted by an operator a content of a maintenance work to be executed and thereafter returning to the second step, the seventh step being executed when it is decided at the sixth step that there is equipment trouble, equipment quality deficiency, or product quality failure.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENT

Before the description of the present invention proceeds, it is to be noted that like parts are designated by like reference numerals throughout the accompanying drawings.

A production system of circuit boards of a preferred embodiment of the present invention will be described with reference to FIGS. 1–8.

Figure 1:
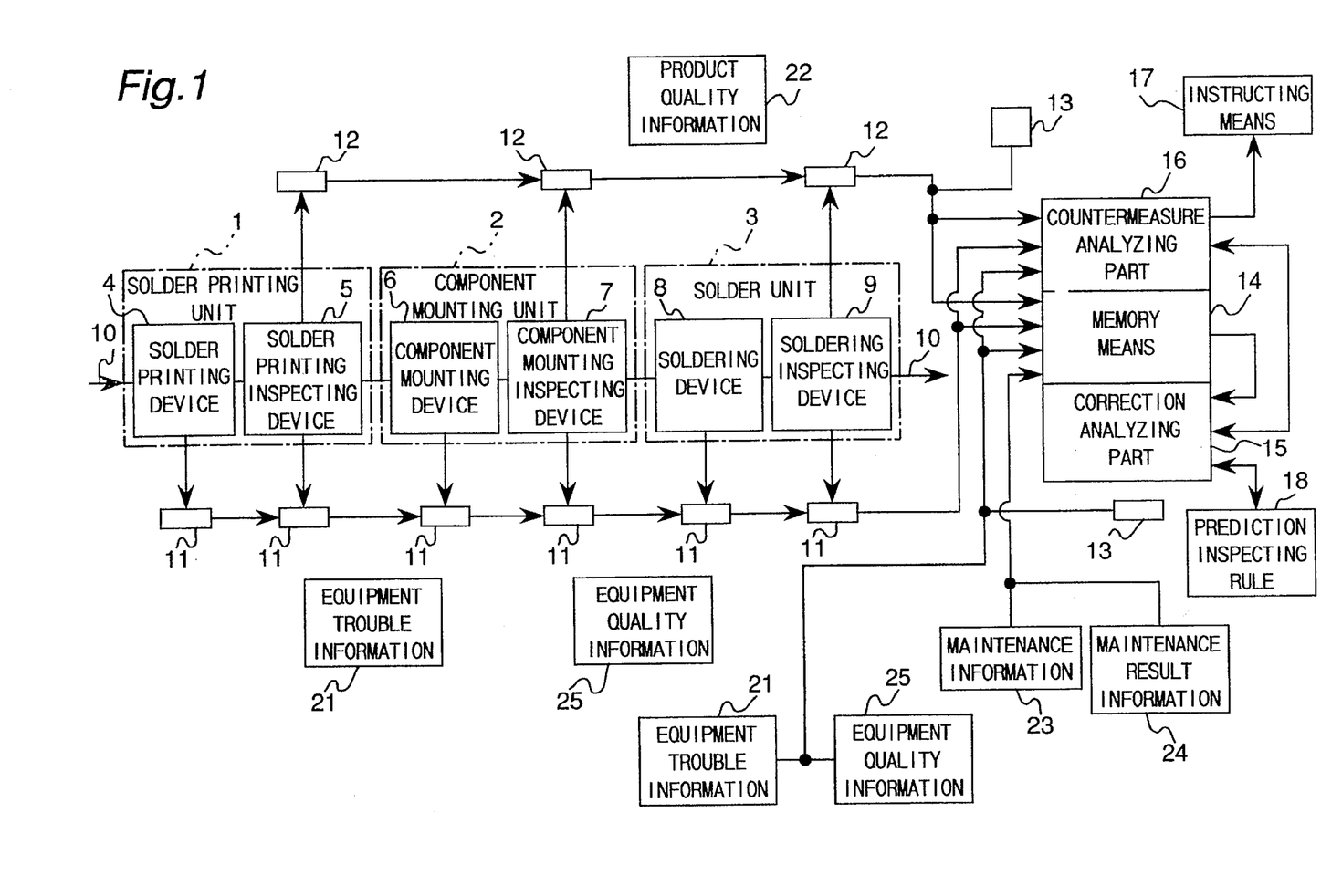
FIG. 1 is a block diagram showing the constitution of a production system of mounting electronic components on circuit boards according to one embodiment of the present invention.
Figure 2:
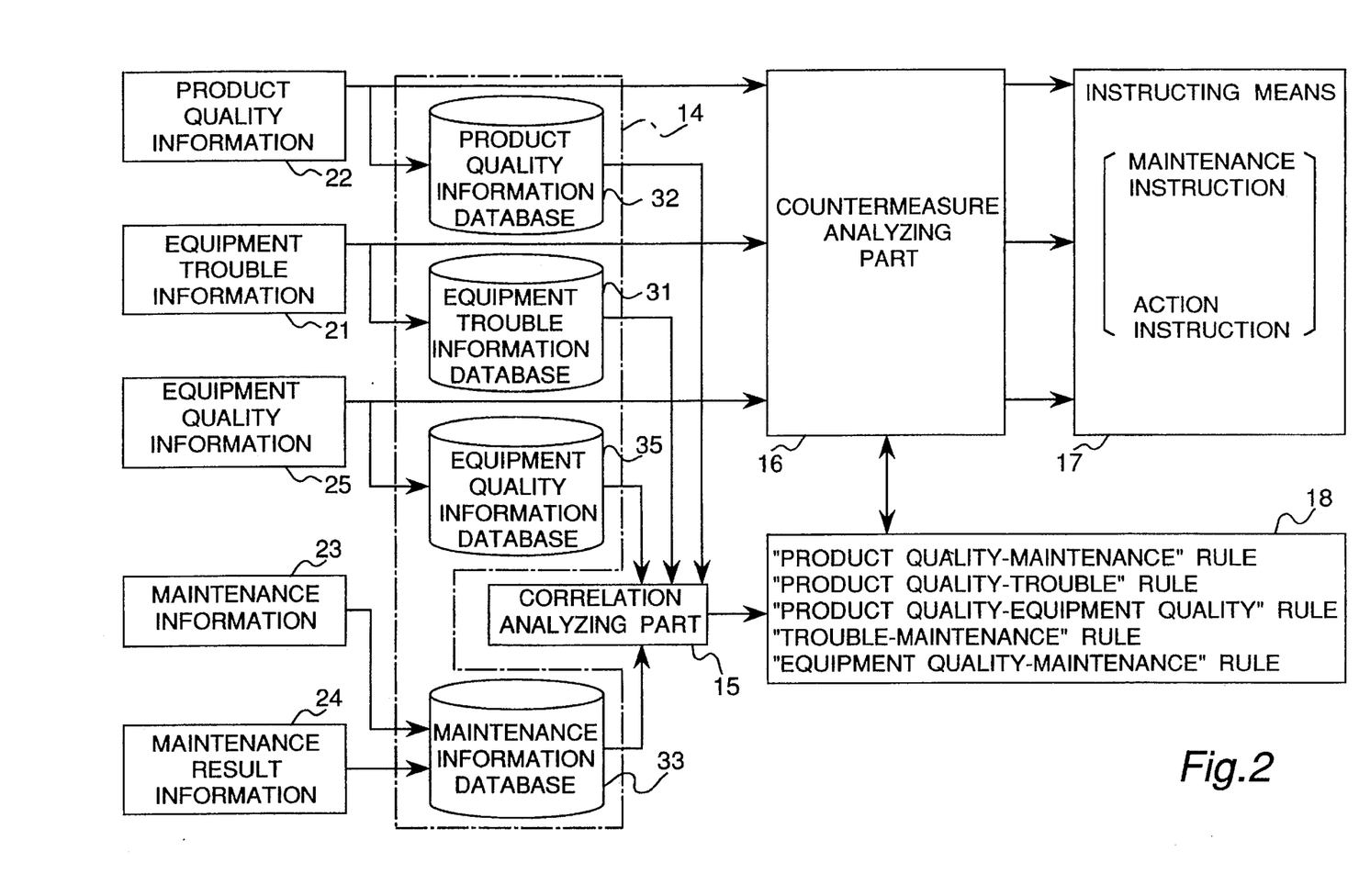
FIG. 2 is a block diagram showing a part of the system of FIG. 1 in detail.

In the production system shown in FIGS. 1 and 2, a solder printing unit 1, an electronic component mounting unit 2 and a soldering unit 3 are sequentially disposed in the downstream direction along a transfer line 10.

A solder printing device 4 in the solder printing unit 1 prints cream solder onto lands of a to-be-printed article such as a circuit board, etc. A solder printing inspecting device 5 inspects the state of the circuit board and the solder printing unit 1 and also the printing state of the cream solder.

In the component mounting unit 2, an electronic component mounting device 6 moves a suction nozzle using an XY driving device. As a result, the suction nozzle carries an electronic component from a component feeding position to a mounting position on the circuit board, and mounts the electronic component on the cream solder printed on the lands of the circuit board. At the time of mounting the electronic component, the suction nozzle is controlled through an electronic component recognizing camera to avoid erroneous operations. An electronic component mounting inspecting device 7 inspects the states of the electronic component and the component mounting unit 2 and the mounting state of the electronic component.

When the circuit board with the solder printed thereon and the electronic component mounted thereon is placed on a transfer conveyor and transferred thereby into the next soldering unit 3, a soldering device 8 melts the solder in a reflow furnace using the hot wind of a heater and a fan, and thereafter the solder cools and hardens the solder. A soldering inspecting device 9 inspects the state of the soldering unit 3 and the soldering state.

Although the above procedure in the production system of the present invention is the same as in the prior art, a great difference is found in the constitution described below.

Subsequent to the real time processing in a network of an equipment trouble information data collecting means 11 and the manipulation of a key-in means 13 by an operator, an equipment trouble information data 21 and an equipment quality information data 25 are collected from each processing means and inspecting means of the solder printing unit 1, component mounting unit 2, and soldering unit 3. The information data 21, 25 are stored in a memory means 14 and also inputted to a countermeasure analyzing part 16. The equipment trouble information data 21 in the embodiment includes, for example, mark-recognizing errors and lack of a cleaning roll paper in the solder printing device 4; clogging of the suction nozzle, erroneous cutting of a top tape, and erroneous switching of the nozzle in the component mounting device 6; and dropping of the circuit board, a decrease of the ambience temperature, and a rise of $O_2$ concentration in the soldering device 8, etc. As shown in FIG. 2, the above data is stored in an equipment trouble information database 31 of the memory means 14. Meanwhile, the equipment quality information data 25 in the embodiment includes, e.g., the distribution of the shifting amount of the mark at the recognizing time of the mark by the solder printing device 4, the rate of defective suction and the rate of poor recognition of the component mounting device 6, or the temperature profile, the speed of the conveyor, and the concentration of $O_2$ in the soldering device 8, etc. The data is, as indicated in FIG. 2, stored in an equipment quality information database 35 of the memory means 14.

A maintenance information data 23 and a maintenance result information data 24, that is, whether or not the result of a maintenance work is good or whether the maintenance work accompanies a secondary phenomenon, etc. are inputted to the memory means 14 through the key-in means 13 operated by an operator. More specifically, the maintenance information data 23 and the maintenance result information data 24 are such as cleaning of the suction nozzle and exchange of a filter in the component mounting device 6, adjustment of the transfer width and the feeding interval of circuit boards, control of the outer temperature, and increase of the flow rate of $N_2$ gas in the soldering device 8, etc. The information data 23, 24 are stored in a maintenance information database 33 of the memory means 14.

The network of the collecting means 12 collects the product quality information data 22 outputted from each inspecting device of the solder printing unit 1, component mounting unit 2, and soldering unit 3, stores the collected data in the memory means 14 and also inputs the data to a countermeasure analyzing part 16. The product quality information data 22 in the embodiment includes data such as blurring and shift of printing, the presence/absence of the printing solder, and the rate of defective printing outputted from the solder printing inspecting device 5, and lack and erection of components, a shift of the mounting position, an error of polarity of the mounted component, and the rate of defective mounting of components outputted from the inspecting device 7, etc. The information data 22 is stored in a product quality information database 32 of the memory means 14 as shown in FIG. 2. In this case, the information data can be inputted through the key-in means 13 manipulated by the operator.

The constitution and operation to process the collected data will be described with reference to FIGS. 1 and 2.

A correlation analyzing part 15 combines items of data in the equipment trouble information data 21, product quality information data 22, maintenance information data 23, maintenance result information data 24, and equipment quality information data 25 stored in the memory means 14, analyzes the frequency of each item, and makes a rule 18 to predict or estimate the result from the cause, the cause from the result, and the result from the maintenance work or action among the troubles, quality, and maintenance work.

For instance, in the embodiment, the correlation analyzing part 15 confirms the effectiveness of the maintenance work for each item of trouble in the equipment trouble information database 31 based on the maintenance record and the maintenance result record of the maintenance information database 33. What is confirmed as effective is stored as the "trouble-maintenance" rule 18.

On the basis of the maintenance record and the maintenance result record of the maintenance information database 33, the correlation analyzing part 15 confirms the effectiveness of the maintenance work for each item of the equipment quality information database 35 and thus stores the effective ones as "equipment quality-maintenance" rule 18.

Similarly, the correlation analyzing part 15 confirms the presence/absence of peculiar points showing sudden increase or decrease and the correlation of the peculiar points in the deficiency rate and inspecting items of the product quality information database 32 for each item of the equipment trouble, maintenance, and equipment quality information databases 31, 33, and 35, thereby storing correlative ones as "product quality-trouble" rule 18, "product quality-maintenance" rule 18, and "product quality-equipment quality" rule 18.

Although the above-described rules 18 are preliminarily registered by the correlation analyzing part 15, additional rules are also registered and accumulated through the ordinary production.

After various kinds of rules are registered by the correlation analyzing part 15, the countermeasure analyzing part 16 utilizes the rules in the following manner, as shown in FIGS. 1 and 2.

As indicated in FIG. 2, the countermeasure analyzing part 16 outputs a maintenance instruction or an action instruction to be executed to an instructing means 17 from the information data 21, 22, 25, 23, and 24 according to the above rule 18. The instructing means 17 displays the maintenance instruction or action instruction. As examples of the display of the instructing means 17, the instruction is displayed on a display device, a lamp indicating the instruction is turned on, or a signal indicating the instruction is outputted to equipment to process the signal.

For instance, the countermeasure analyzing part 16, upon receipt of the equipment trouble information data 21 from the collecting means 11, generates at real time in accordance with the "trouble-maintenance" rule 18 a maintenance instruction to the instructing means 17 to execute the maintenance work the effectiveness of which is confirmed. Then, the instructing means 17 displays the outputted maintenance instruction.

When the equipment quality information data 25 indicating that the equipment quality becomes poor is generated from the collecting means 11 and received by the countermeasure analyzing part 16, the countermeasure analyzing part 16 sends a maintenance instruction to execute the maintenance work having the confirmed effectiveness to the instructing means 17 at real time in accordance with the "equipment quality-maintenance" rule 18. Then, the instructing means 17 displays the maintenance instruction.

When the product quality information data 22 indicative of the generation of the inferior product quality is received from the collecting means 12 by the countermeasure analyzing part 16, the countermeasure analyzing part 16 outputs a maintenance instruction to execute the effective maintenance to the instructing means 17 at real time in accordance with the "product quality-maintenance" rule 18, whereby the maintenance instruction is displayed at the instructing means 17.

Table 1 shows an example of the data registered in the database when the maintenance work is carried out to solve the equipment troubles and defective equipment quality. The time when the trouble occurs and when the apparatus is resumed, the maintenance result, and the like are registered altogether.

TABLE 1

Trouble/maintenance information database

| | | | | |
|---|---|---|---|---|
| Time of occurrence | 10:00 | 10:30 | 11:00 | 12:00 |
| Time of resumption | | 10:35 | | |
| Machine | Mα-1 | SPP-α | Mα-3 | Mα-3 |
| Part (roughly classified) | Head | Screen | Z-axis | Z-axis |
| Details of trouble | Decrease of suction rate of No. 5 nozzle | Lack of soldering Increase of deficiency rate | Z interlock | Z interlock |
| To-be-inspected and confirmed item | Clog of nozzle | Clog of screen | Motor driver | F/V waveform |
| Treatment | Cleaning of nozzle | Execution of cleaning | No abnormality | Regulation of gain |
| Result | Good suction rate (99.9%) | Decrease of deficiency rate (0.1%) | Recurrence at 12:00 | Good |
| Remark | | | | |

Figure 3:
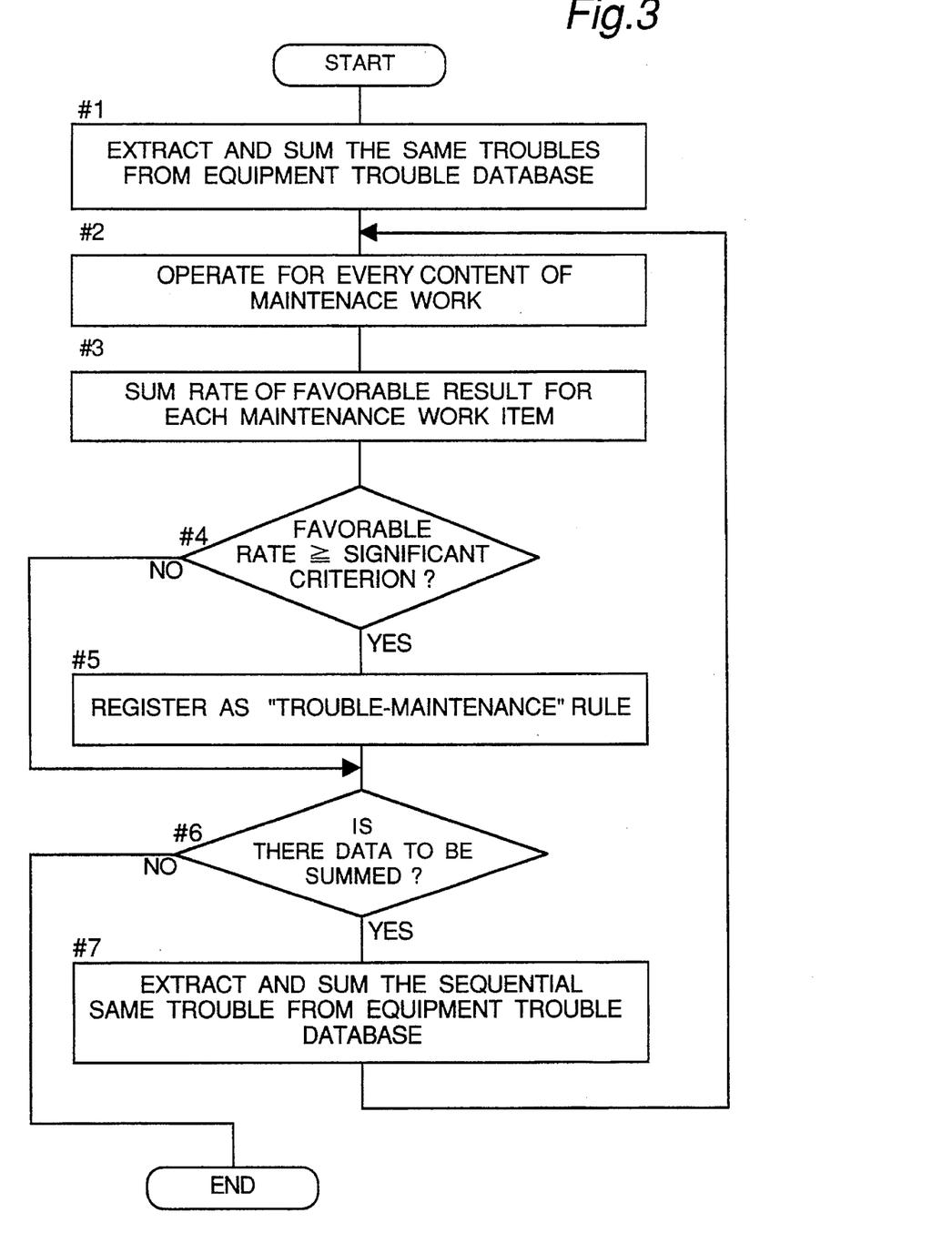
FIG. 3 is a flow chart of an algorithm to determine a "trouble-maintenance" rule in FIGS. 1 and 2.
Figure 4:
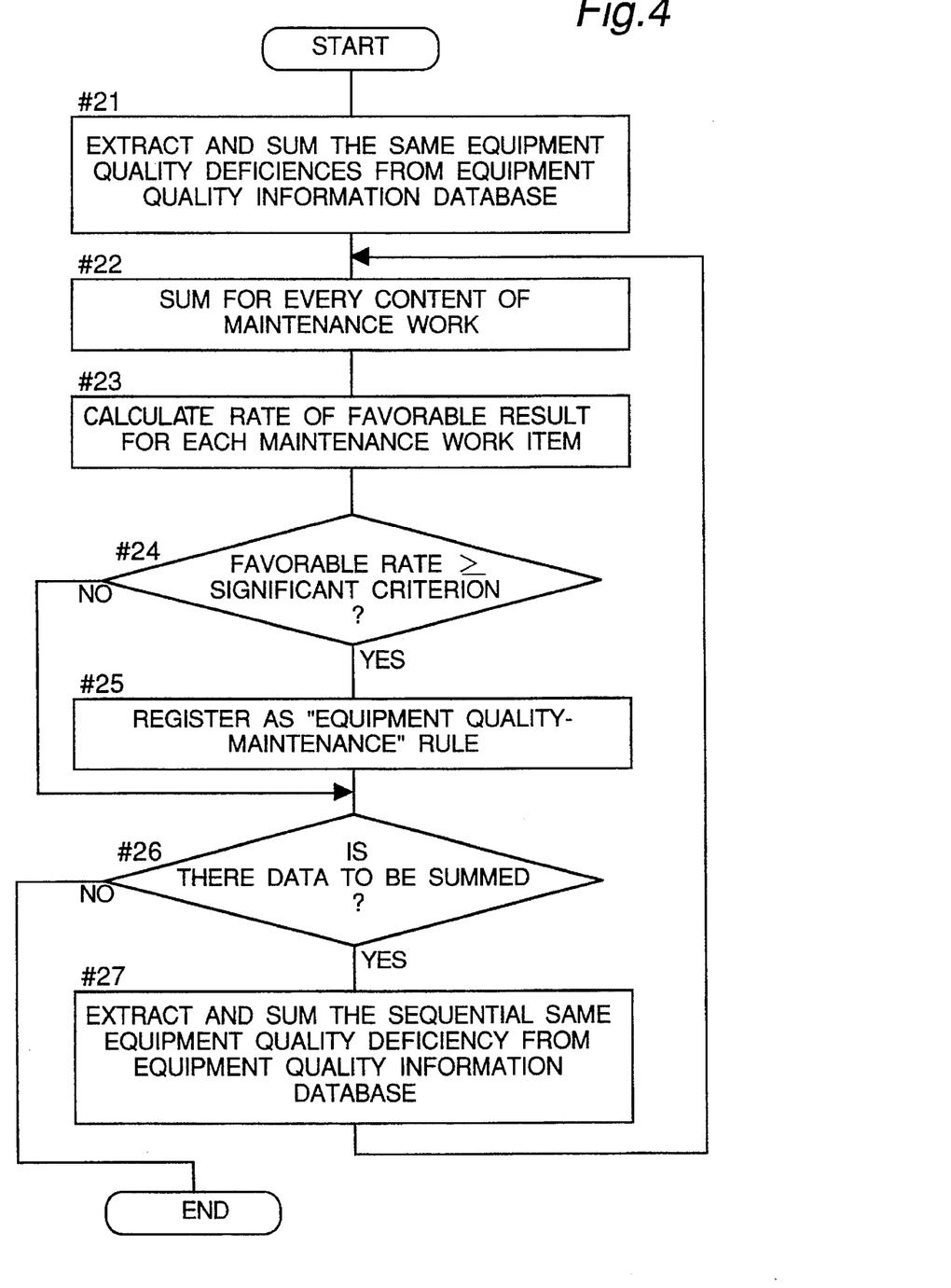
FIG. 4 is a flow chart of an algorithm to determine an "equipment quality-maintenance" rule in FIGS. 1 and 2.
Figure 5:
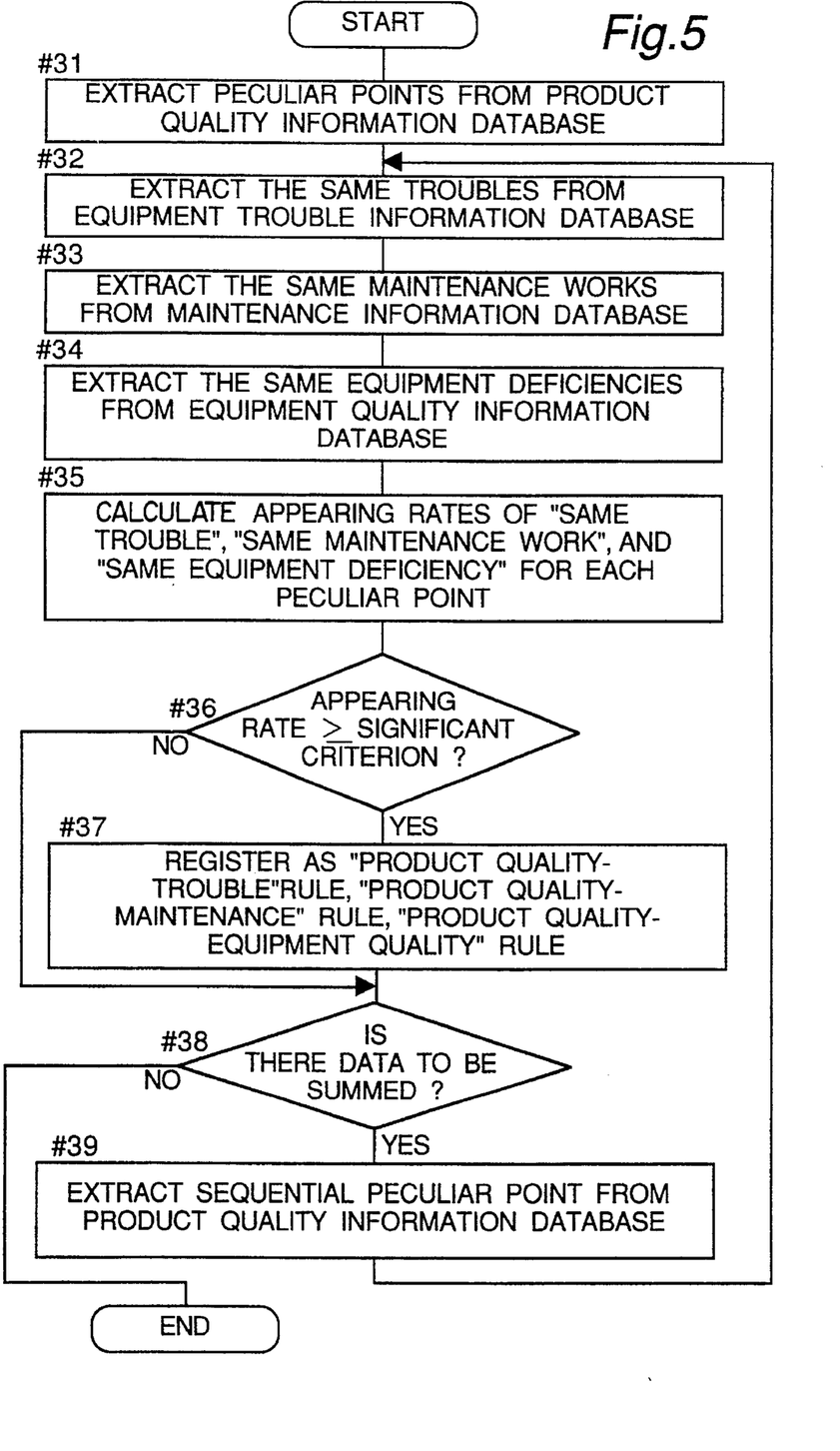
FIG. 5 is a flow chart of an algorithm to determine a "product quality-trouble" rule, a "product quality-maintenance" rule, and a "product quality-equipment quality" rule.

FIGS. 3–5 are flow charts of the algorithm for the correlation analyzing part 15 to determine each rule.

FIG. 3 is a flow chart of the algorithm when the "trouble-maintenance" rule 18 is determined.

At step #1 of FIG. 3, the correlation analyzing part 15 extracts and sums the same troubles from the equipment trouble information database 31, and then extracts the trouble of the highest frequency to proceed to step #2.

At step #2, the correlation analyzing part 15 resums the extracted trouble for every content of the maintenance work to proceed to step #3.

Then, at step #3, the correlation analyzing part 15 calculates the rate of favorable result for each maintenance item to proceed to step #4.

At step #4, the rate of favorable results is compared with significant criterion, e.g., 70%. If the rate is not smaller than the significant criterion, the correlation analyzing part 15 decides that the maintenance work is effective, proceeding to step #5. On the other hand, if the rate is smaller than the significant criterion, the correlation analyzing part 15 decides that the maintenance work is ineffective, proceeding to step #6.

At step #5, the correlation analyzing part 15 registers the trouble and the effective maintenance work as the "trouble-maintenance" rule 18, and moves to step #6.

At step #6, the correlation analyzing part 15 decides whether or not there is data to be summed. If no, the processing is terminated. If yes, the processing proceeds to step #7.

At step #7, the correlation analyzing part 15 extracts and sums the next same troubles from the equipment trouble information database 31 and returns to step #2.

The foregoing algorithm when applied to the production system of the embodiment will be concretely described below.

In the case, for example, where a "switching error of the suction nozzle" is brought about at the mounting device 6, the equipment trouble information data 21 containing the "switching error of the suction nozzle" is transmitted to the memory means 14 and the correlation analyzing part 15 via the data collecting means 11. "Cleaning of the nozzle" is consequently carried out. Supposing that this kind of trouble is generated ten times and the maintenance work therefor is executed ten times, and nine out of ten results well, while the remaining one is caused by break of an exchanging component of the nozzle and thus the work results not well. At this time, the maintenance work succeeds 90%. Accordingly, the correlation analyzing part 15 registers the "cleaning of the nozzle" as the "trouble-maintenance" rule 18 for the case is where the "switching error of the suction nozzle" brought about.

FIG. 4 is a flow chart of the algorithm when the correlation analyzing part 15 determines the "equipment quality-maintenance" rule 18.

At step #21 of FIG. 4, the correlation analyzing part 15 extracts and sums the same deficiencies of the equipment quality from the equipment quality information database 35. The deficiency of the equipment quality with the highest frequency, e.g., "exceeding the criterion of the suction deficiency rate" is extracted by the correlation analyzing part 15 to proceed to step #22.

At step #22, the correlation analyzing part 15 sums again for every content of the maintenance work, e.g., "cleaning of the nozzle", "exchange of the filter", "exchange of the cassette", "exchange of the roll", etc. in the extracted deficiency of "exceeding the criterion of the suction deficiency rate" to proceed to step #23.

At the following step #23, the correlation analyzing part 15 calculates the rate of favorable result for each item of the maintenance work for the deficiency "exceeding the criterion of the suction deficiency rate" to proceed to step #24.

At step #24, the correlation analyzing part 15 compares the rate with significant criterion, for instance, 70%. When the rate is not smaller than the significant criterion, the correlation analyzing part 15 decides the maintenance work as effective, proceeding to step #25. However, if the rate is smaller than the significant criterion, the correlation analyzing part 15 decides the maintenance work to be ineffective and moves to step #26.

At step #25, the correlation analyzing part 15 registers the deficiency and the effective maintenance work as the "equipment quality-maintenance" rule 18.

At step #26, the correlation analyzing part 15 decides whether or not there is data to be summed. If no, the processing is terminated. If yes, the processing proceeds to step #27.

At step #27, the next same troubles are extracted and summed from the equipment quality information database 35 and the correlation analyzing part 15 returns to step #22.

FIG. 5 is a flow chart of the algorithm when the correlation analyzing part 15 determines the "product quality-trouble" rule 18, "product quality-maintenance" rule 18, and "product quality-equipment quality" rule 18.

In FIG. 5, at step #31, the correlation analyzing part 15 extracts points where the product quality shows the same change (peculiar points), e.g., when the rate of poor soldering of the circuit board is increased 5% in a certain time, from the product quality information database 32 to proceed to step #32.

At step #32, the correlation analyzing part 15 extracts the same troubles at the extracted peculiar points, for instance, "switching error of the suction nozzle", "transferring error of the circuit board" and the like from the equipment trouble information database 31 to proceed to step #33.

At step #33, the correlation analyzing part 15 extracts from the maintenance information database 33 the executing history of maintenance work in the vicinity of the extracted peculiar points, e.g., one hour before and after the peculiar points. The executing history is, for example, "adjustment made to solve the transferring system error of the mounting device", "exchange of the nozzle filter", "re-regulation of the inspecting accuracy of the cassette" and the like. At the same time, the correlation analyzing part 15 confirms the changes of the extracted peculiar points after the maintenance works, that is, the results of the maintenance works, e.g., "the deficiency is reduced", "the deficiency is increased", "no change", etc. to proceed to step #34.

At step #34, the correlation analyzing part 15 extracts from the equipment quality information database 35 the content in the vicinity of the above extracted peculiar points, e.g., one hour before and after the peculiar points, namely, "the suction deficiency rate exceeds a predetermined level", "the recognizing deficiency rate exceeds a predetermined level", etc. to proceed to step #35.

At step #35, the correlation analyzing part 15 calculates the appearing rates of the "same trouble", "same maintenance work", and "same equipment deficiency" for each of the peculiar points extracted as above to proceed to step #36.

Subsequently, at step #36, the correlation analyzing part 15 compares the calculated rate with significant criterion, for instance, 70%, and decides that the "same trouble", "same maintenance work", and "same equipment deficiency" are correlated to the quality change points (peculiar points) when the rate is equal to or larger than the significant criterion, then proceeding to step #37. If the rate is smaller than the significant criterion, the correlation analyzing part 15 decides that the "same trouble", "same maintenance work", and "same equipment deficiency" are not related to the changing points of the product quality (peculiar points), then proceeding to step #38.

At step #37, the correlation analyzing part 15 registers the correlated results as the "product quality-trouble" rule 18, "product quality-maintenance" rule 18, and "product quality-equipment quality" rule 18 to proceed to step #38.

At step #38, the correlation analyzing part 15 decides whether or not there is data to be summed. If no, the processing is terminated. If yes, the processing proceeds to step #39.

At step #39, the correlation analyzing part 15 extracts a sequential peculiar point from the product quality information database 32, and returns to step #32.

Figure 6:
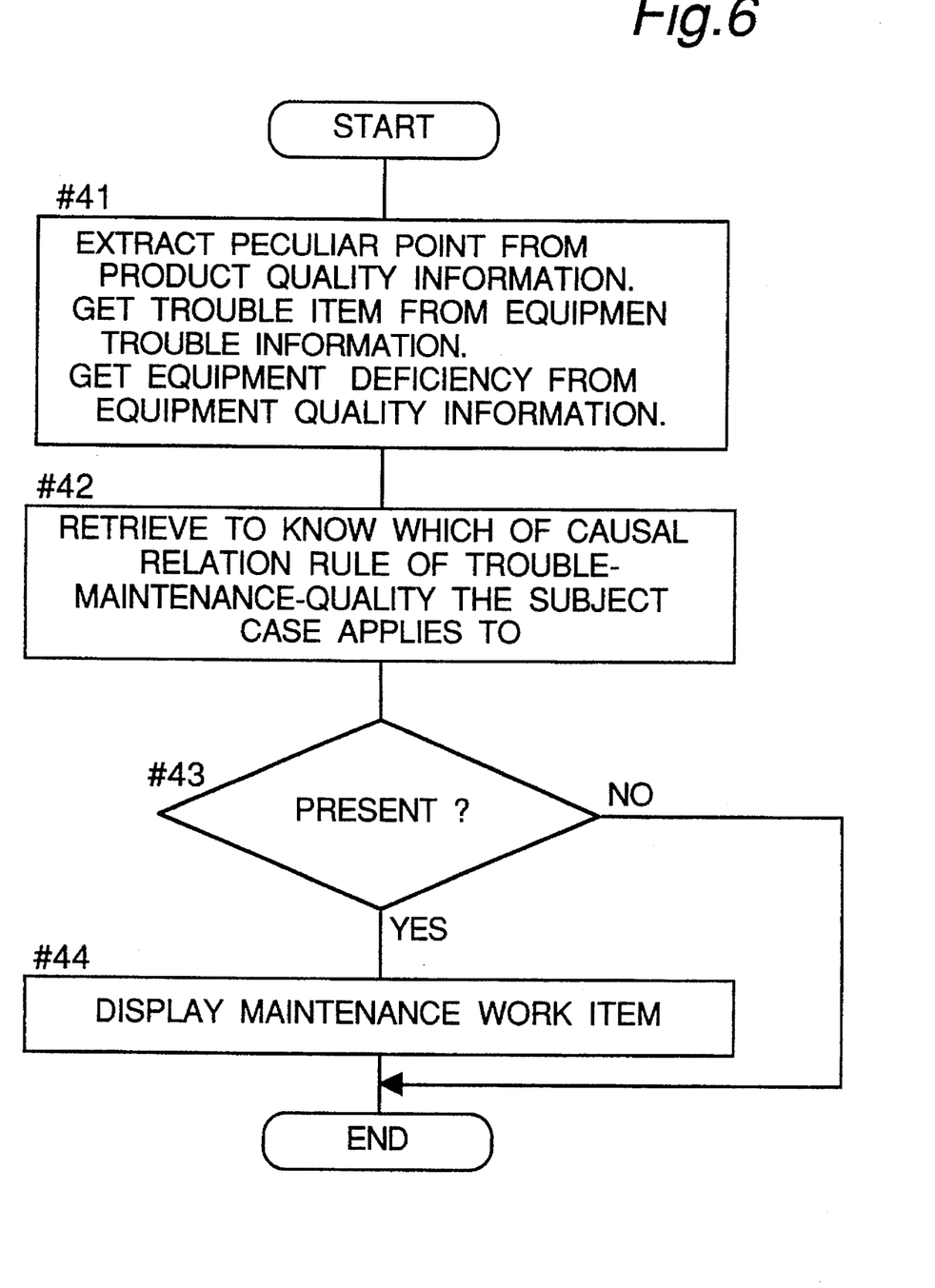
FIG. 6 is a flow chart of an algorithm to determine a maintenance instruction in FIGS. 1 and 2.

FIG. 6 is a flow chart of the algorithm when the countermeasure analyzing part 16 decides a "maintenance instruction" or "action instruction" from the information data 22, 21, and 25 on the basis of the "product quality-trouble" rule 18, "product quality-maintenance" rule 18, "product quality-equipment quality" rule 18, "trouble-maintenance" rule 18, and "equipment quality-maintenance" rule 18.

The memory means 14 regularly receives and stores the inputs of the information data 21–25 from the collecting means 11 and 12 and the key-in means 13 manipulated by the operator.

In the case where the product quality includes a peculiar point, for example, when the product quality is suddenly enhanced or lowered, or apt to be gradually enhanced or decreased, or repeatedly enhanced and lowered in a short time, or if the switching error of the nozzle outbreaks, or the equipment quality deficiency, e.g., suction deficiency rate is over a reference value, the countermeasure analyzing part 16 retrieves to know which of the "product quality-maintenance" rule 18, "trouble-maintenance" rule 18, and "equipment quality-maintenance" rule 18 the subject case applies to. Then, the countermeasure analyzing part 16 determines the maintenance work such as checking and re-adjusting of the cassette, cleaning of the nozzle, exchange of the filter, etc. The determined maintenance work is transmitted to the display means 17 which in turn displays the maintenance work.

Table 2 is a list of instructions of the maintenance work in the above case. The list shows examples of the above rules. The "Status" in the list indicates the peculiar point in quality information.

TABLE 2

List of instructions for maintenance

| Time | Machine | Status | Check point | Instruction of maintenance work |
|---|---|---|---|---|
| 10:00 | Mα-1 | Mounting rate tends to decrease | Nozzle No. 5 99% → 95% (latest state) | Exchange the filter |
| 10:10 | Mα-2 | Mounting rate is suddenly decreasing | Nozzle 5 99% → 70% (latest state) | Inspect whether the nozzle is omitted |
| 10:20 | Mα-3 | Mounting rate tends to decrease | Z5 99% → 95% (latest state) | Inspect feeding of the tape |
| 10:30 | Mα-4 | Mounting rate is suddenly decreasing | Z10 99% → 70% (latest state) | Inspect clogging of the dust chute |
| 10:40 | SPP-α | Printing area tends to increase | ±3% → +10% (latest state) | Inspect the temperature rise of cream solder |
| 10:50 | SPP-α | Printing area is suddenly increasing | ±3% → +30 (latest state) | Inspect the pressing value of squeegee |
| 11:00 | SPP-α | Printing area tends to | ±3% → −10% (latest state) | Inspect the temperature |

TABLE 2-continued

List of instructions for maintenance

| Time | Machine | Status | Check point | Instruction of maintenance work |
|---|---|---|---|---|
| | | decrease | | of cream solder |
| 11:10 | SPP-α | Printing area is suddenly decreasing | ±3% → −30% (latest state) | Inspect the remaining amount of cream solder |
| 11:20 | SPP-α | Printing is shifted in X+ direction | 0 mm → 1 mm (latest state) | Confirm the position of screen |
| 11:30 | SPP-α | Variance of printing shift is increasing | 1 → 3 (latest state) | Inspect clamping of PCB |
| 11:40 | SPP-α | Rate of printing failures tends to increase | 1% → 5% (latest state) | Execute screen checking |
| 11:50 | SPP-α | Shift of the printing position is increasing | 0 mm → 2 mm (latest state) | Inspect clamping of PCB |
| 12:00 | SPP-α | Lack of printing tends to increase | 1% → 5% (latest state) | Inspect the remaining amount of solder |
| 12:10 | SPP-α | Printing tends to blur increasingly | 1 → 5 (latest state) | Inspect the temperature of solder |
| 12:20 | Mα-3 | Mounting is shifted in Y+ direction | 0 mm → 4 mm (latest state) | Inspect the reference pin |
| 12:30 | Mα-4 | Variance of mounting shift is increasing | 1 → 3 (latest state) | Inspect clamping of PCB |

Figures 7, 7A:
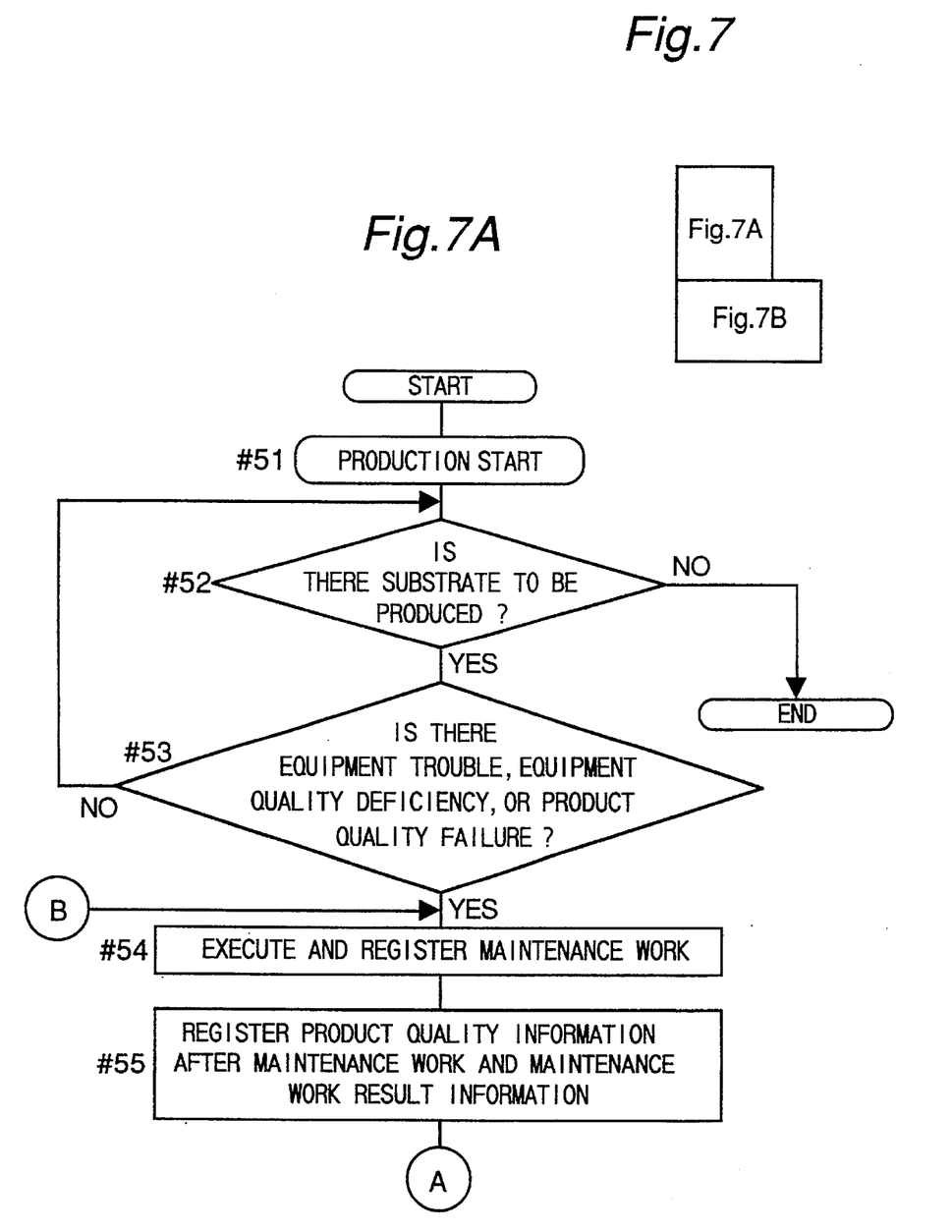
FIG. 7 is a diagram showing the relationship between FIGS. 7A and 7B.
FIGS. 7A and 7B are flow charts of the production system in FIG. 1.
Figure 7B:
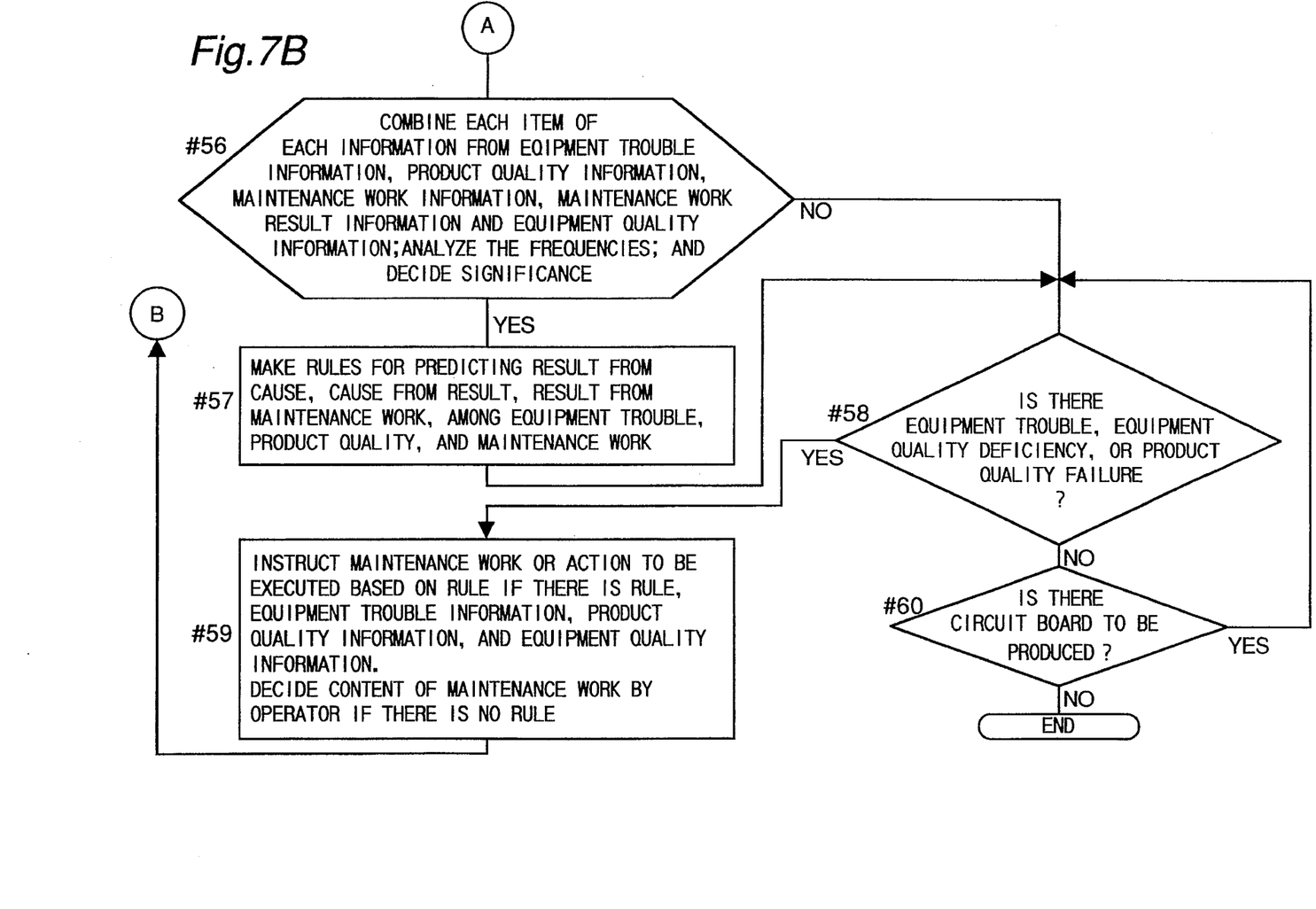

FIGS. 7A and 7B show flow charts of the whole of the production system in FIG. 1.

At step #51, production is started to proceed to step #52.

At step #52, the correlation analyzing part 15 decides whether or not there is data to be summed. If no, the processing is terminated. If yes, the processing proceeds to step #53.

At step #53, it is decided based on the data collected by the collecting means 11 and 12 whether or not there is equipment trouble, equipment quality deficiency, or product quality failure. If no, the processing returns to step #52 to find any equipment trouble, equipment quality deficiency, or product quality failure during the production. If yes at step #53, the processing proceeds to step #54.

At step #54, a maintenance work for the trouble, deficiency, or failure is executed and registered in the memory means 14 to proceed to step #55.

At step #55, product quality information and maintenance work result information is registered in the memory means 14 after the maintenance work is executed, and then the processing proceeds to step #56.

At step #56, each item of each information from the equipment trouble information, the product quality information, the maintenance work information, the maintenance work result information, and the equipment quality information is combined with each other. Then, the frequency of each item is analyzed, and then its significance is decided. If the maintenance work is effective, the processing proceeds to step #57. If the maintenance work is not effective, the processing proceeds to step #58.

At step #57, rules are made for predicting a result from a cause, a cause from a result, and a result from a maintenance work, among the equipment troubles, product qualities, and maintenance works. Then, the processing proceeds to step #58.

At step #58, it is decided based on the data collected by the collecting means 11 and 12. whether or not there is equipment trouble, equipment quality deficiency, or product quality failure. If no, the processing proceeds to step #60. If yes, the processing proceeds to step #59.

At step #59, if there is a rule, a maintenance work or action to be executed is instructed based on the rule and the equipment trouble information, the product quality information, and the equipment quality information. If there is no rule, an operator judges the content of a maintenance work to be executed. Then, the processing returns to step #54.

At step #60, it is decided whether or not there is a circuit board to be produced. If no, the processing is terminated. If yes, the processing proceeds to step #58.

The production system of one aspect of the invention is provided with a first information data input means of data related to equipment such as a solder printing device, a component mounting device, and a soldering device, a second information data input means of data related to results of countermeasures, a memory means, and a correlation analyzing component for analyzing correlation between the first and second data stored in the memory means. The first input means inputs data, for example, related to the equipment troubles generated in any of a solder printing unit, a component mounting unit, and a soldering unit. The second input means inputs data such as the product quality data of items to be inspected by any of a solder printing inspecting devices a component mounting inspecting device, and a soldering inspecting device. At the same time, the memory means stores the inputted equipment trouble data and product quality data. Therefore, in the production system, the first data related to the equipment troubles and the second data related to the product quality among the stored data can be summed and analyzed at real time in the state where the correlation therebetween is clearly defined, so that the equipment troubles can be predicted at real time from the tendency of the product quality data.

In the case where the memory means additionally stores the data related to the maintenance work performed in any of the solder printing unit, component mounting unit, and soldering unit, the production system sums and analyzes all the data correlatively at real time. Accordingly, the equipment troubles can be predicted at real time from the tendency of the product quality data, along with the maintenance work to be executed.

In a further aspect, if the memory means stores the data of the result of the maintenance work carried out in any of the solder printing unit, component mounting unit, and soldering unit in addition to the equipment trouble data, the product quality data, and the maintenance data, the production system is adapted to sum and analyze the above four kinds of data correlatively at real time, thereby predicting the equipment troubles from the tendency of the product quality data as well as the maintenance work to be executed and the result consequent to the maintenance work.

Moreover, in a still further aspect where the memory means stores additionally the equipment quality data for managing the quality of the equipment in any of the solder printing unit, component mounting unit, and soldering unit, the data related to the equipment trouble data, product quality data, maintenance data, maintenance result data, and equipment quality data are summed and analyzed at real time in the clearly correlated form. Accordingly, the equipment troubles can be predicted at real time from the tendency of the equipment quality data. At the same time, the maintenance work to be executed and the result consequent to the execution of the maintenance work can be predicted.

The correlation analyzing part combines corresponding items of the data stored in the memory means, i.e., equipment trouble data, product quality data, maintenance data, maintenance result data, and equipment quality data, thereby to analyze the frequency of each item and make rules to predict or estimate the result from the cause, or the cause from the result. Therefore, the production system is able to quickly respond to the troubles in accordance with the rules.

In a case where a countermeasure analyzing part is provided and outputs a countermeasure instruction such as a maintenance or action instruction to be executed, based on the equipment trouble data, product quality data, equipment quality data, maintenance data, and maintenance result data in accordance with the rules made by the correlation analyzing part. When an instructing means is provided and then the instruction is displayed by the instructing means, a resultive action is promptly taken in response to the instruction concurrently with the occurrence of the trouble.

In summary, in the production system of the present invention, the product quality data collecting means and the key-in means manipulated by the operator collect and store the equipment trouble information data, product quality information data, maintenance information data, maintenance result information data, and equipment quality information data at real time in the memory means. The correlation analyzing part combines each item of the above data stored in the memory means, and analyzes the frequency, thereby forming rules to predict or estimate the result from the cause, cause from the result, and result from the maintenance work or action among the troubles, qualities, and maintenance works. The countermeasure analyzing part generates, in accordance with the rules formed by the correlation analyzing part, a maintenance instruction or action instruction to be executed to the instructing means based on the equipment trouble information data, product quality information data, equipment quality information data, maintenance information data and maintenance result information data. The instructing means displays the maintenance instruction or action instruction. Owing to the above-described arrangement, if the maintenance work or action is required, the operator can respond at real time to the instruction, so that the failure of the system can be prevented promptly from being spread wide.

At the same time, it becomes possible to predict the generation of failures from the tendency of the product quality information data or equipment quality information data. Accordingly, countermeasures to the failures can be carried out prior to the generation of the failures. The working efficiency of the equipment is greatly improved and the product quality is also improved.

Since the additional data is sequentially added to the above-formed rules in the ordinary operation, the burden of the operator is lightened, and the stable product quality and working efficiency are secured at the high level.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A production system for mounting components on circuit boards, comprising:

a solder printing unit having a solder printing device for printing solder onto lands of a circuit board and a solder printing inspecting device for inspecting a print state of the solder printed by said solder printing device and generating an output indicative of said print state;

a component mounting unit having a component mounting device for mounting a component at a predetermined position of the solder printed on the circuit board and a component mounting inspecting device for inspecting a mounting state of the component mounted by said component mounting device and generating an output indicative of said mounting state;

a soldering unit having a soldering device for melting and then hardening the solder printed on the circuit board and a soldering inspecting device for inspecting a solder state of the solder melted and then hardened by the soldering device and generating an output indicative of said solder state;

a data memory;

a first information data input means for inputting into the data memory first data indicative of functional characteristics of each of the devices of the solder printing unit, component mounting unit, and soldering unit;

a second information data input means for inputting into the data memory second data indicative of inspection results based on at least said outputs of the respective inspecting devices;

a correlation analyzing part for combining maintenance works and corresponding items of the first and second data stored in the data memory and analyzing a frequency of each item, and for then generating a plurality of rules denoting a result from a cause, a cause from a result, and a result from a maintenance work among the first data, second data, and maintenance works.

2. The production system as claimed in claim 1, wherein the first data includes equipment trouble information denoting troubles caused in the respective devices of the printing unit, component mounting unit, and soldering unit; and the second data includes product quality information denoting a product quality obtained by the inspection carried out by the respective inspecting devices in the printing unit, component mounting unit, and soldering unit.

3. The production system as claimed in claim 2, wherein the first data includes maintenance information denoting maintenance works executed in the devices in the printing unit, component mounting unit, and soldering unit.

4. The production system as claimed in claim 3, wherein the second data includes maintenance result information denoting results of maintenance works executed in the devices in the printing unit, component mounting unit, and soldering unit.

5. The production system as claimed in claim 4, wherein the first data includes equipment quality information denoting an operational quality of the respective devices in the printing unit, component mounting unit, and soldering unit.

6. The production system as claimed in claim 3, wherein the first data includes equipment quality information denoting an operational quality of the respective devices in the printing unit, component mounting unit, and soldering unit.

7. The production system as claimed in claim 2, wherein the first data includes equipment quality information denoting an operational quality of the respective devices in the printing unit, component mounting unit, and soldering unit.

8. The production system as claimed in claim 1, further comprising a countermeasure analyzing part for outputting a countermeasure instruction to be executed in accordance with a rule made by the correlation analyzing part and the first and second data.

9. The production system as claimed in claim 8, further comprising an instructing means for displaying the countermeasure instruction output by the countermeasure analyzing part.

10. A production system for mounting components on circuit boards, comprising:

- a solder printing unit having a solder printing device for printing solder onto lands of a circuit board and a solder printing inspecting device for inspecting a print state of the solder printed by said solder printing device and for generating an output indicative of said print state;
- a component mounting unit having a component mounting device for mounting a component at a predetermined position of the solder printed on the circuit board and a component mounting inspecting device for inspecting a mounting state of the component mounted by said component mounting device and for generating an output indicative of said mounting state;
- a soldering unit having a soldering device for melting and then hardening the solder printed on the circuit board and a soldering inspecting device for inspecting a solder state of the solder melted and then hardened by the soldering device and for generating an output indicative of said solder state;
- a data memory;
- a first information data input means for inputting into the data memory first data which is indicative of functional characteristics of each of the devices in the printing unit, component mounting unit, and soldering unit and which includes equipment trouble information denoting troubles caused in the devices in the printing unit, component mounting unit, and soldering unit, maintenance information denoting maintenance works executed in the devices in the printing unit, component mounting unit, and soldering unit, and equipment quality information denoting an operational quality of the devices in the printing unit, component mounting unit, and soldering unit;
- a second information data input means for inputting into the data memory second data which is indicative of inspection results based on at least said outputs of the respective inspecting devices and which includes product quality information denoting a quality of products obtained by in the printing unit, component mounting unit, and soldering unit, and maintenance result information denoting results of maintenance works executed in the devices in the printing unit, component mounting unit, and soldering unit;
- a correlation analyzing part for combining corresponding items of the first and second data stored in the data memory and analyzing a frequency of each item, for then generating a plurality of rules denoting a result from a cause, a cause from a result, and a result from a maintenance work among the first data, second data, and maintenance works.

11. The production system as claimed in claim 10, further comprising a countermeasure analyzing part for outputting a countermeasure instruction to be executed in accordance with a rule made by the correlation analyzing part and the first and second data.

12. The production system as claimed in claim 11, further comprising an instructing means for displaying the countermeasure instruction output by the countermeasure analyzing part.

* * * * *